United States Patent
Deeman et al.

(10) Patent No.: US 8,277,919 B2
(45) Date of Patent: Oct. 2, 2012

(54) REFLECTIVE COATING FOR AN OPTICAL DISC

(75) Inventors: Neil Deeman, Alamo, CA (US); Jerry E. Hurst, Jr., Boulder Creek, CA (US)

(73) Assignee: VMO Systems, Inc., Boulder, CO (US)

( * ) Notice: Subject to any disclaimer, the term of this patent is extended or adjusted under 35 U.S.C. 154(b) by 351 days.

(21) Appl. No.: 12/507,868

(22) Filed: Jul. 23, 2009

(65) Prior Publication Data

US 2011/0020667 A1    Jan. 27, 2011

(51) Int. Cl.
B32B 3/02    (2006.01)

(52) U.S. Cl. .................. 428/64.1; 428/64.4; 430/270.12

(58) Field of Classification Search .............. 428/64.4; 430/270.12

See application file for complete search history.

(56) References Cited

U.S. PATENT DOCUMENTS

| | | | |
|---|---|---|---|
| 5,392,263 A | 2/1995 | Watanabe et al. | |
| 5,508,981 A | 4/1996 | Watanabe et al. | |
| 5,510,164 A | 4/1996 | Best et al. | |
| 5,515,346 A | 5/1996 | Watanabe et al. | |
| 5,533,001 A | 7/1996 | Watanabe et al. | |
| 5,587,990 A | 12/1996 | Watanabe et al. | |
| 5,596,566 A | 1/1997 | Taki | |
| 5,757,733 A | 5/1998 | Watanabe et al. | |
| D400,868 S | 11/1998 | Fujisawa | |
| 5,838,646 A | 11/1998 | Watanabe et al. | |
| 5,910,932 A | 6/1999 | Watanabe et al. | |
| 5,914,915 A | 6/1999 | Watanabe et al. | |
| 5,976,641 A * | 11/1999 | Onishi et al. .................. 428/1.3 |
| 6,069,868 A | 5/2000 | Kashiwagi | |
| 6,243,327 B1 | 6/2001 | Nakaoki et al. | |
| 6,246,656 B1 | 6/2001 | Kawakubo et al. | |
| 6,262,948 B1 | 7/2001 | Watanabe et al. | |
| RE37,428 E | 10/2001 | Watanabe et al. | |
| 6,301,200 B1 | 10/2001 | Aspen et al. | |
| 6,395,365 B1 | 5/2002 | Hayashi | |
| 6,465,069 B1 | 10/2002 | Kobayashi et al. | |
| 6,544,616 B2 | 4/2003 | Nee | |
| 6,704,275 B2 | 3/2004 | Netsu et al. | |
| 6,707,787 B2 | 3/2004 | Yamasaki et al. | |
| 6,747,943 B2 | 6/2004 | Netsu et al. | |
| 6,785,222 B2 | 8/2004 | Netsu et al. | |
| 6,823,528 B2 | 11/2004 | Yamasaki et al. | |

(Continued)

OTHER PUBLICATIONS

"Blue-ray Disc", Wikipedia, the free encyclopedia, http://en.wikipedia.org/w/indix.php?title=Blue-ray_Disc&printable=yes, printed Apr. 3, 2008, 15 pages.

(Continued)

*Primary Examiner* — Elizabeth Mulvaney
(74) *Attorney, Agent, or Firm* — Patentability Associates

(57) ABSTRACT

An optical disc includes a substrate layer, a cover layer, and an aluminum alloy layer that is between the substrate layer and cover layer, and is adjacent to the substrate layer. The aluminum alloy layer includes a majority amount of aluminum and an additional metal selected from the group consisting of: chromium, titanium, tantalum, and any combination thereof. A method of making an optical disc includes the steps of: forming a substrate layer; sputtering an aluminum alloy target onto the substrate layer to form an aluminum alloy layer; and forming a cover layer; wherein the aluminum alloy layer comprises a majority amount of aluminum and an additional metal selected from the group consisting of: chromium, titanium, tantalum, and any combination thereof.

23 Claims, 2 Drawing Sheets

U.S. PATENT DOCUMENTS

| | | | |
|---|---|---|---|
| 6,875,489 B2 * | 4/2005 | Koya et al. | 428/64.1 |
| 6,882,616 B2 | 4/2005 | Ichimura et al. | |
| 6,987,723 B2 | 1/2006 | Ichimura et al. | |
| 7,013,476 B2 | 3/2006 | Volk et al. | |
| 7,058,959 B2 | 6/2006 | Volk et al. | |
| 7,089,571 B2 | 8/2006 | Volk et al. | |
| 7,092,343 B2 | 8/2006 | Sabi et al. | |
| 7,138,164 B2 | 11/2006 | Ono et al. | |
| 7,275,252 B2 | 9/2007 | Volk et al. | |
| 7,295,508 B2 | 11/2007 | Ueda et al. | |
| 7,305,689 B2 | 12/2007 | Netsu et al. | |
| 7,307,941 B2 | 12/2007 | Yamasaki et al. | |
| 7,316,837 B2 | 1/2008 | Nee | |
| 7,318,232 B2 | 1/2008 | Masuhara et al. | |
| 7,353,528 B2 | 4/2008 | Hayashibe et al. | |
| 7,506,347 B2 | 3/2009 | Volk et al. | |
| 2005/0112019 A1 * | 5/2005 | Nakai et al. | 420/550 |
| 2006/0048167 A1 | 3/2006 | Volk et al. | |
| 2008/0009270 A1 | 1/2008 | Volk et al. | |
| 2008/0273115 A1 | 11/2008 | Packman et al. | |
| 2008/0282282 A1 | 11/2008 | Volk et al. | |
| 2009/0129248 A1 | 5/2009 | Hurst, Jr. et al. | |
| 2009/0136218 A1 | 5/2009 | Packman et al. | |
| 2009/0144763 A1 | 6/2009 | Hurst, Jr. et al. | |
| 2009/0147655 A1 | 6/2009 | Volk et al. | |

OTHER PUBLICATIONS

"Blu-ray Disc Association", Wikipedia, the free encyclopedia, http://en.wikipedia.org/w/index.php?title=Blue-ray_Disc_Association&printable=yes, printed Apr. 3, 2008, 8 pages.

"File: Image-Metal-reflectance.png", Wikipedia, the free enclyclopedia, http://en.wikipedia.org/wiki/File:Image-Metal-reflectance.png, printed Jul. 1, 2009, 3 pages.

"H.264/MPEG-4 AVC", Wikipedia, the free encyclopedia, http://en.wikipedia.org/w/index.php?title=H.264/MPEG-4_AVC&printable=yes, printed Apr. 3, 2008, 16 pages.

"River CDR80 Prem White/Diamond IJ TSRDF", http://www.rpadistribution.co.uk/Itemdesc.asp?ic=5060158310623, printed May 18, 2009, 4 pages.

* cited by examiner

REFLECTIVE COATING FOR AN OPTICAL DISC

FIELD

The technology disclosed herein relates to high-volume data storage, more particularly it relates to optical discs.

BACKGROUND AND SUMMARY

Read-Only Memory (ROM) optical discs are designed to store large amounts of digital information that is accessible over many years of lifetime of the product. Such discs should be readable by a drive device provided it meets certain specification requirements that do not change appreciably over the lifetime of the product.

The reflectivity of optical ROM discs is normally enhanced by the addition of a thin, highly reflective coating made of metal or metal alloys at the data surface. The choice of material is primarily dependent upon its reflectivity at the wavelength of the read back laser, its stability in the operating environment over the lifetime of the product, and the cost of the material, though other factors are also involved, e.g. roughness and uniformity of the coating.

Silver alloys have been used in optical discs for several years. Although silver alloys perform well in accelerated life tests, silver is expensive and does not have the highest reflectivity per unit thickness compared to some other metals. The reflectivity of silver alloy is even less optimal at the 405 nm wavelength, the wavelength that "Blue-Ray" discs are read at. Other metals such as aluminum have higher reflectivity at 405 nm per unit thickness and lower cost, but they suffer from corrosion and have poor durability. Corrosion can be a particularly difficult factor for miniature discs that are designed for mobile devices. Such discs may be subjected to higher temperatures as they are carried outside and are exposed to higher heat and humidity levels.

One factor that affects the quality and performance of the read back signal of an optical disc is the thickness of the reflective layer. The thickness of the reflective layer needs to be sufficient to meet the minimum reflectivity requirement, and this is about 15 nm for a conventional silver alloy reflective layer. The thickness of the reflective layer should not be so thick that it causes a distortion in the read back signal. In a conventional silver alloy reflective layer, if the thickness is greater than approximately 25 nm the jitter of the data signal increases and the error rates increase to unacceptable values. This limitation in the maximum practical thickness of the reflective layer limits the maximum reflectivity of the optical disc. Optical discs work better with high signal-to-noise ratios, since this will minimize data errors. So it is desirable to have discs with higher reflectivity.

Herein, an optical disc is provided that includes a substrate layer, a cover layer, and an aluminum alloy layer that is between the substrate layer and cover layer, and is adjacent to the substrate layer. The aluminum alloy layer includes a majority amount of aluminum and an additional metal selected from the group consisting of: chromium, titanium, tantalum, and any combination thereof.

Herein, a method is provided for making an optical disc including the steps of: forming a substrate layer; sputtering an aluminum alloy target onto the substrate layer to form an aluminum alloy layer; and forming a cover layer; wherein the aluminum alloy layer comprises a majority amount of aluminum and an additional metal selected from the group consisting of: chromium, titanium, tantalum, and any combination thereof.

A method for making an optical disc is also provided that includes the steps of: forming a substrate layer; sputtering a first target including a majority amount of an additional metal onto the substrate layer, wherein the additional metal is chromium, titanium, tantalum, and any combination thereof, thereby forming an additional metal layer; sputtering a second target including a metal onto the additional metal layer, wherein the metal is aluminum, thereby forming an aluminum layer; and forming a cover layer. The aluminum alloy layer comprises a majority amount of aluminum and an additional metal selected from the group consisting of: chromium, titanium, tantalum, and any combination thereof.

DETAILED DESCRIPTION

An example optical disc with excellent reflectivity, low jitter, excellent corrosion resistance, and reduced cost is described herein. The example optical disc includes an aluminum alloy reflective layer. The aluminum component provides cost reduction from the commonly used silver alloy reflective layers and also has low jitter. The aluminum alloy includes a minor amount of an additional metal that provides protection from moisture and results in improved corrosion resistance. The additional metal layer also does not diminish the other properties of the reflective layer.

Reflectivity is one of the key optical properties that an optical disc must maintain for reliable performance. The reflectivity of optical ROM discs is normally enhanced by the addition of a thin, highly reflective coating made of metal or metal alloys at the data surface.

Aluminum has excellent reflectance, particularly at the 405 nm wavelength where it exceeds that of silver alloys. Aluminum is also cheaper than silver. Unfortunately, discs made with pure aluminum as the reflective layer at the data surface do not survive accelerated life tests (80° C., 85% RH for 96 hours) due to the formation of multiple corrosion sites that produce errors in the data read back.

It was unexpectedly discovered that a small amount of chromium or similar metals can passivate the aluminum and create an aluminum alloy that far exceeds the corrosion resistance and durability of pure aluminum, and is on par, if not better than, the conventional silver alloys.

Figure 1:
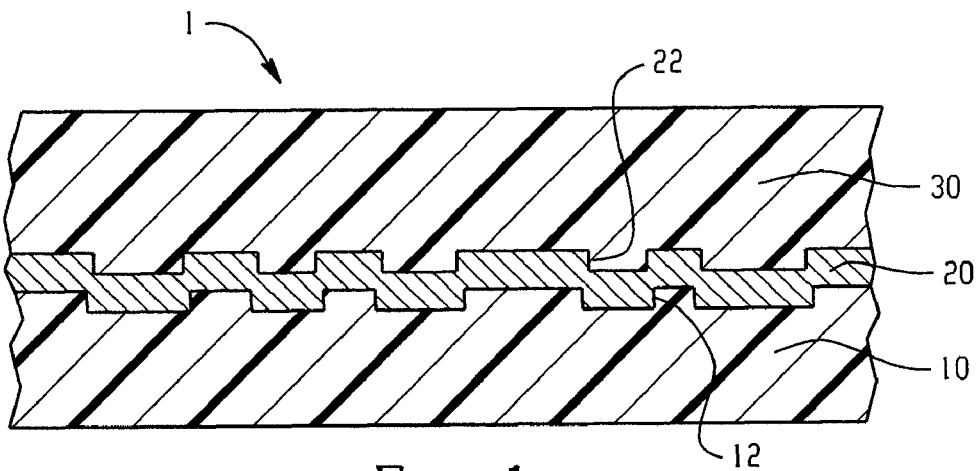
FIG. 1 is cross-sectional view of an example aluminum alloy disc.

FIG. 1 shows a cross-sectional view of an example optical disc 1. The optical disc 1 is a flat, circular disc which contains data encoded in microscopic pits. The optical disc 1 is read by short-wavelength visible-light lasers, such as Blue-Ray lasers that read data at a wavelength of approximately 405 nm, DVD lasers that read data at a wavelength of approximately 640 nm, and CD type lasers that read data at a wavelength of approximately 780 nm. Though a structure for a readable only disc is shown in the Figures, in other examples the discs may be recordable or re-recordable.

The example optical disc 1 may, for example, be a DVD-ROM, CD-ROM, mini-DVD, or a miniature Vmedia disc, such as those that are operable in the Vmedia ROM disc drives disclosed in U.S. Published Application 2008/0273115 entitled "Multimedia Presentation Format" and U.S. Published Application 2007/0079014, entitled "Method of Operating a Disc Drive and a Host Device," and U.S. Published Application 2006/0062095 entitled "Cell Phone or Other Portable Handset Containing Microminiature Optical Disc Drive," which are incorporated herein by reference. The example optical disc 1, may, for example, have a 32 mm diameter and a thickness of 0.6 mm to 0.7 mm, and be configured to fit into a cartridge having a form factor of 36 mm×36 mm×2.8 mm, such as the Vmedia cartridges described in U.S. Published Application 2006/0048167, entitled "Cartridge for Miniature Optical Data Storage Disc," or U.S. Published Application 2008/0282282, entitled "Method of Fabricating Cartridge for Miniature Optical Data Storage Disc," which are incorporated herein by reference. Vmedia discs are particularly suited for use in mobile devices and thus may be subjected to higher heat and/or humidity conditions, and may thus have a need for enhanced durability.

The example optical disc 1 includes a substrate layer 10. The substrate layer 10 may, for example, be a polycarbonate material, as is typically used in optical discs. The substrate layer has pits 12 stamped into it that function to encode the information. The substrate layer may be 0.1 mm or greater in thickness, such as 0.1 mm and 2.0 mm, 0.30 to 0.75 mm, or 0.55 mm.

The aluminum alloy layer 20 is adjacent to the substrate layer 10 and conforms to the contours of the pits 12 in the substrate layer 10 leaving correlating pits 22 on its upper surface. This upper surface is the data surface of the optical disc 1. The aluminum alloy layer 20 may be sputtered, or otherwise deposited onto the substrate layer 10 as explained in more detail below. The thickness of the aluminum alloy layer 20 needs to be sufficient to meet the minimum reflectivity requirement. The thickness of the aluminum alloy layer 20 should also not be so thick as to distort the optical readback signal. Thus, an example range of thickness for the aluminum alloy layer 20 is 15 nanometers to 100 nanometers, such as 20 nanometers to 75 nanometers, or 25 nanometers to 5 nanometers.

The aluminum alloy layer 20 has a high reflectivity per unit thickness and thus provides a significantly better signal-to-noise ratio, such as less than 8% data to clock jitter, or less than 6% data to clock jitter, over conventional silver alloys. Reflectance (R) can be calculated from the measured refractive index (n) and the absorption coefficient (k) of the material by the well known Fresnel formula;

$$R=((n-1)^2+k^2)/((n+1)^2+k^2)$$

Aluminum at 400 nm wavelength has the following values: n=0.490, k=4.86 therefore R=92.4%. In contrast, silver at 400 nm wavelength has the following values: n=0.173, k=1.95 therefore R=86.6%

Aluminum is the major component of the aluminum alloy layer 20. For example, the aluminum accounts for 51 to 99.9% of the total weight of the aluminum alloy layer 20, such as 80% to 96%, 90% to 99.9%, or 98% to 99.5%.

The aluminum alloy layer 20 has an additional metal component that includes chromium, titanium, or tantalum, or any combination thereof. Without being bound by theory it is believed that chromium, titanium, and tantalum will passivate the aluminum and also do not diminish the other properties of the aluminum alloy layer 20.

The additional metal accounts for 0.1 to 49% of the total weight of the aluminum alloy layer 20, such as 4% to 20%, 0.1% to 10%, or 0.5% to 2%.

As shown by the experimental data below, the additional metal passivates the aluminum, thereby providing improved durability by protecting from corrosion. Without being bound by theory, it is believed that the additional metal atoms migrate to the upper and lower surfaces of the aluminum alloy layer 20, providing enhanced corrosion protection that protects the inside aluminum alloy.

It is believed that the improved durability of the optical discs shown in the Experimental Examples section below is due to the surface corrosion protection provided by the additional metal. Moisture can seep in through the substrate layer 10 and cause the reflective layer to corrode, thereby deteriorating its performance. This is particularly true with an aluminum reflective layer.

The cover layer 30 is adjacent to the aluminum alloy layer 20 and fills in the pits 22 formed in the aluminum alloy layer 20. The top surface of the cover layer 30 is smooth. The cover layer 30 may, for example, be made of a combination of PSA (pressure sensitive adhesive-acylic resin) and PC (polycarbonate), but other optically transparent and stable material can be used. In one embodiment the cover layer is essentially free of UV cured hardcoat. The thickness of the cover layer 30 can vary according to the type of disc drive the optical disc 1 is designed to be used in. Example thicknesses include, 0.050 to 1.0 mm, such as 0.075 to 0.35 mm, or 0.90 to 0.120 mm, or 0.11 mm. The thickness may vary slightly through the disc, as an example, variations of +/−0.001 to 0.020 mm, +/−0.002 to 0.010 mm, or +/−0.005 to 0.07 mm are possible. The refractive index may, for example, range from 1.0 to 2.0, such as 1.2 to 1.8, or 1.5 to 1.7.

The example optical disc 1 is made by a first example process as described herein. The substrate layer 10 is made from a polycarbonate resin material, as is typically used in optical discs. The substrate layer 10 is manufactured by injection or compression molding the polycarbonate resin into a disc, such as a Vmedia disc. The upper surface of the substrate layer 10 is molded or stamped with pits 12 to encode information.

After stamping, the aluminum alloy layer 20 is deposited over the substrate layer 10. In the example method, the aluminum alloy layer 20 is deposited by sputtering. Thermal evaporation, glow discharge, ion plating, and chemical vapor deposition may also be used. Kirk-Othmer, Encyclopedia of Chemical Technology, 3rd ed. Vol. 10, pp. 247 to 283, offers a detailed explanation of these and other deposition techniques, and this specification hereby incorporates that disclosure by reference.

The aluminum alloy may be sputtered by using a composite sputtering target that includes aluminum and the additional metal. In another example, the aluminum alloy may be sputtered by using multiple targets for each metal of the aluminum alloy. For some applications, the composite target method is preferred, because it is a simpler more cost-effective process.

Next, the cover layer 30 is applied over the aluminum alloy layer 20. The cover layer 30 is applied by rolling onto the sputtered substrate. The cover layer 30 in this example is comprised of PSA/PC. The cover layer 30 protects the aluminum alloy layer 20 from handling and the ambient environment. Optionally, a label may be applied to the cover layer 30. The cover layer can be applied by other means for example pressing, stamping and spin coating.

Figure 2:
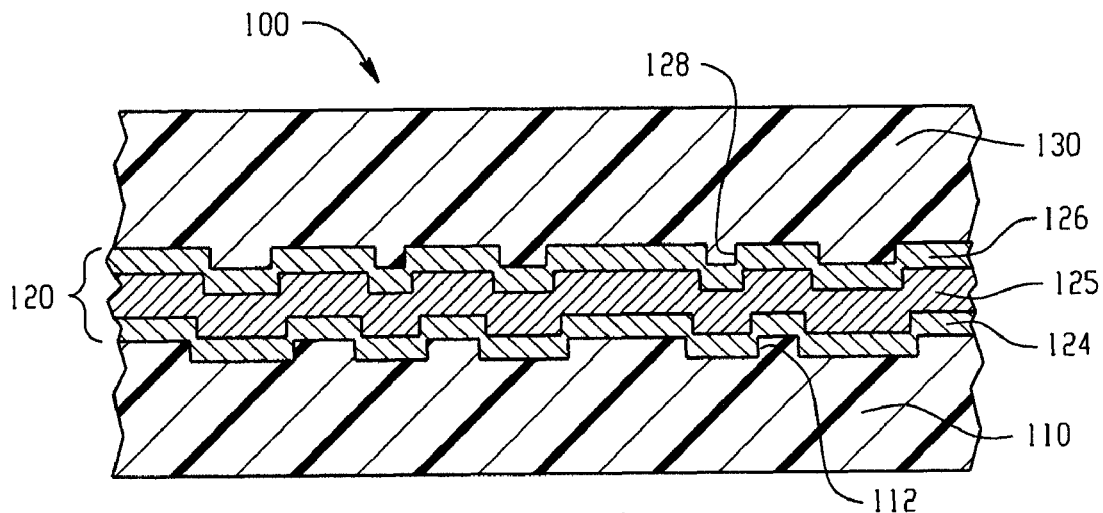
FIG. 2 is cross-sectional view of a second example aluminum alloy disc.

In a second example optical disc 100, shown in FIG. 2, the optical disc 100 also has a substrate layer 110, an aluminum alloy layer 120, and a cover layer 130. However, in the second example optical disc 100, the aluminum alloy layer 120 has a multi-layered structure.

The substrate layer 110 and the cover layer 130 have the same features in the second example optical disc 100 as the substrate layer 10 and the cover layer 30 in the first example optical disc 1.

The aluminum alloy layer 120 in the second example optical disc 100 has three layers, a first additional metal layer 124, a second additional metal layer 126, and an aluminum metal layer 125. The first additional metal layer 124 is adjacent to the substrate layer 110. The aluminum metal layer 125 is adjacent to the first additional metal layer 124, and the second additional metal layer 124 is adjacent to the aluminum layer 110.

The aluminum alloy layer 120 conforms to the contours of the pits 112 in the substrate layer 110 leaving correlating pits 128 on its upper surface. The aluminum alloy layer 120 may be sputtered onto the substrate layer 110 as explained in more detail below. The thickness of the aluminum alloy layer 120 needs to be sufficient to meet the minimum reflectivity requirement. The thickness of the aluminum alloy layer 120 should also not be so thick as to distort the optical readback signal. Thus, an example range of thickness for the aluminum alloy layer 20 is 10 nanometers to 200 nanometers, such as 15 nanometers to 100 nanometers, or 15 nanometers to 35 nanometers.

The first and second additional metal layers 124, 126 include a metal selected from chromium, titanium, and tantalum, or any combination thereof. The first and second additional metal layers 124, 126 in the second example optical disc 100 consist essentially of chromium, titanium, and tantalum, or any combination thereof. In another example, the first and second additional metal layers 124, 126 may also be alloyed with another metal. For example, the other metal could make up 0.5 to 50% of the additional metal layers 124, 126. Each of the first and second additional metal layers 124, 126 may have a thickness of 5 to 100 nanometers, or 3 nanometers to 25 nanometers, such as 5 nanometers to 15 nanometers, or 15 nanometers to 25 nanometers.

The aluminum metal layer 125 in the second example optical disc 100 consists essentially of aluminum. In another example, the aluminum metal layer 125 may be alloyed with another metal. For example, the aluminum metal layer 125 includes at least 50% aluminum, such as 75% to 100%, 90% to 100%, or 98 to 99.5% aluminum. An example range of thickness for the aluminum alloy layer 120 is thickness of 3 nanometers to 25 nanometers, such as 5 nanometers to 15 nanometers, or 15 nanometers to 25 nanometers.

Figure 3:
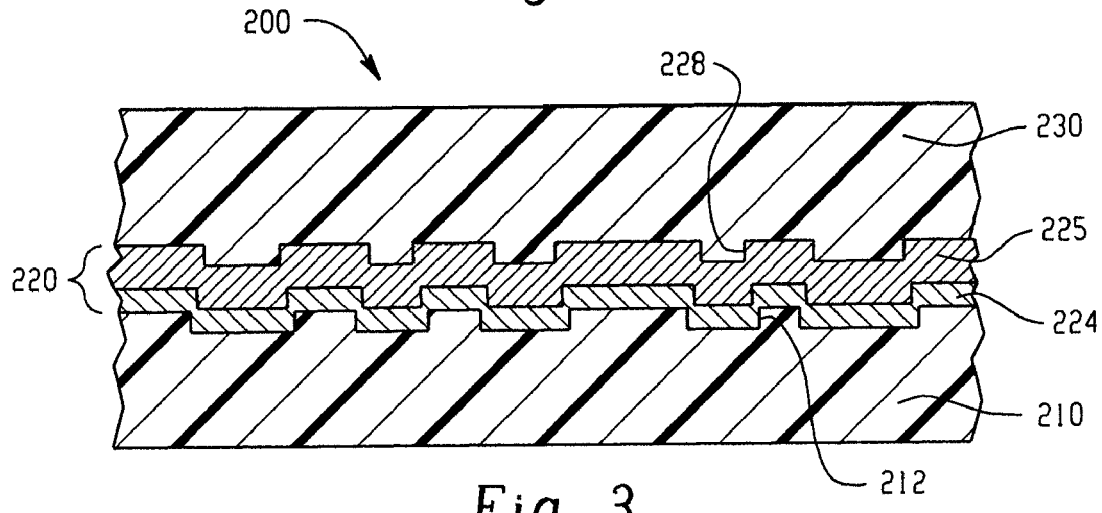
FIG. 3 is a cross-sectional view of a third example aluminum alloy disc.

In a third example optical disc 200, shown in FIG. 3, the third example optical disc 200 has a substrate layer 210, an aluminum alloy layer 220, and a cover layer 230. The third example optical disc 200 has a multi-layered aluminum alloy layer 220 like the second example optical disc 100; however, there is only one additional metal layer 224 in the third example optical disc 200.

The substrate layer 210, the cover layer 230, the aluminum layer 225, and the additional metal layer 224 have the same features in the third example optical disc 200 as their counterparts in the second optical disc 100. The only configurational difference from the second example disc 100 is that the aluminum layer 225 is directly adjacent to the cover layer 230 in the third example optical disc 200, and as mentioned before, a second additional metal layer is absent. The thicknesses of the aluminum layer 225 and the additional metal layer 224 may also vary. An example range of thickness for the aluminum alloy layer 220 is 5 nanometers to 200 nanometers, such as 3 nanometers to 25 nanometers, such as 5 nanometers to 15 nanometers, 15 nanometers to 25 nanometers, or 3 nanometers to 8 nanometers. An example range of thicknesses for the additional metal layers 224 is 3 nanometers to 25 nanometers, such as 5 nanometers to 15 nanometers, or 3 nanometers to 8 nanometers.

As indicated by the Experimental Examples below, the single additional metal layer 224 will provide substantially the same durability-enhancing moisture barrier effect that is present in the second example optical disk 100. This is because the primary culprit of corrosion is believed to be moisture penetrating through the substrate layer 210, and the additional metal layer 224 is adjacent to the substrate layer 210.

Variations of the above examples may also be effective in some applications, such as optical discs that include reflective layers having multiple aluminum and more than two additional metal layers. One example of such a variation is a reflective layer including a first additional metal layer, an aluminum layer, a middle additional metal layer, a second aluminum layer, and a third additional metal layer.

A second example process that may be used to make the example second and third optical discs is described herein. The second example process is the same as the example process described above as it relates to the substrate layer and the cover layer of the discs. However, the process for making the multilayered aluminum alloy layers 120, 220 is different.

In the second example process, formation of the aluminum alloy layer 120, 220 is begun by sputtering the substrate layer 110, 210 with an additional metal. In other examples, thermal evaporation, glow discharge, ion plating, and chemical vapor deposition may alternatively be used. Sputtering equipment using a target made of chromium, titanium, tantalum, or mixtures thereof is employed to make the (first) additional metal layer 124, 224. Subsequently, a second target made of aluminum is used to sputter the aluminum layer 125, 225 onto the (first) additional metal layer 124, 224. Additional layers, such as the second additional metal layer 126 in the first example optical disk 100 may also be sputtered over the aluminum layer 125, 225. Single or multiple chambers may be used for the separate sputtering steps.

The following experimental examples are presented for purposes of illustration only and are not to be construed in a limiting sense.

EXPERIMENTAL EXAMPLES

Composite Aluminum Alloy Examples

In Examples 1-30, three series of discs, (10 discs per series) were made and tested for defect error rates using Vmedia ROM drives, VMedia ODD-ES2 available from Vmedia Research Inc., Boulder, Colo. Each series was made with a different reflectivity layer at the data surface.

The substrate layer was made by injection molding of polycarbonate onto a stamper that has the data pits preformed on the surface. The plastic replica conforms to the surface of the stamper thereby copying the data pits. Data was formed on the surface of the substrate during the injection molding process.

A commercial optical disc sputtering system, Cube Lite from Oelikon Balzers AG was used to make Examples 1-30. The configuration was changed from a standard installation used in DVD disc manufacture to accommodate the smaller Vmedia disc size of approximately 32 mm×32 mm×0.6 mm (which is housed in a cartridge of dimensions 36 mm×36 mm×2.8 mm). This involved some modification to the inner and outer masking system to accommodate the smaller Vmedia disc radius.

The targets for each example were made according to the information in the "Reflective Layer" column of Table 1. The targets were configured to the ARQ131 design required by the Cube Lite system. This allowed for the easy exchange of targets with different compositional make up. Standard sputtering conditions for 100% aluminum target were used without modification for each target, even though some targets were composite targets of aluminum and chromium. The approximate following sputtering conditions were used that yield approximately 35 nm sputter thickness.

| | |
|---|---|
| Sputter Time | 3 sec |
| Sputter Power | 2.5 kW |
| Argon Flow Rate | 5 SCCM |
| Main Chamber Vacuum | 250 Pa |

The Example discs were subsequently protected with a cover layer. The cover layer was applied by rolling it onto the sputtered surface.

The layers had the following thicknesses: silver alloy—25 nanometers; pure aluminum—25 nanometers; aluminum+2% chromium—25 nanometers.

Each series was divided in to two groups of five discs each. The first groups were exposed to an accelerated life test with the following conditions: 70° C. at 50% relative humidity (RH) for 96 hours. The second groups were exposed to a more extreme accelerated life test with the following conditions: 80° C. at 85% RH for 96 hours. After the accelerated life tests, each disc was subjected to twenty-four hours of conditioning at room temperature (25° C.) and 50% RH. In both the conditioning and accelerated life tests the discs were held horizontally and supported at the middle, non data area of the disc and separated from each other to allow air flow over the top and bottom surfaces of the discs. After conditioning and the accelerated life tests, the discs were retested for defect error rates on the same Vmedia ROM drives. The error rates are recorded as Parity Inner error (PI error) and Parity Inner fail (PI fail) and are generated from the error detection and correction system employed in Vmedia ROM and DVD ROM discs. The results are tabulated in Table 1 below:

TABLE 1

| | | | Before Aging Test | | After Aging Test | |
|---|---|---|---|---|---|---|
| Example Nos. | Reflective Layer Composition | Group | Average PI error | Average PI fail | Average PI error | Average PI fail |
| 1-5 | Silver Alloy | 70° C./50% RH/96 Hrs | 24 | 0.96 | 26.8 | 1.24 |
| 6-10 | Silver Alloy | 80° C./85% RH/96 Hrs | 24.2 | 1 | N/A* | N/A* |
| 11-15 | Pure Aluminum | 70° C./50% RH/96 Hrs | 17 | 0.6 | 16.8 | 0.62 |
| 16-20 | Pure Aluminum | 80° C./85% RH/96 Hrs | 22.2 | 3 | 3838.8 | 217.78 |
| 21-25 | Aluminum + 2% Chromium | 70° C./50% RH/96 Hrs | 25.8 | 1 | 24 | 0.82 |
| 26-30 | Aluminum + 2% Chromium | 80° C./85% RH/96 Hrs | 29.8 | 7.86 | 38.4 | 0.88 |

*Silver Alloy discs after the 80° C./85% RH/96 Hrs aging test could not be read at all.

The results in Table 1 show that error rates in Examples 21-30 (discs made with aluminum+2% chromium) show little change when exposed to 80° C. at 85% RH conditions for 96 hours compared to the 70° C., 50% RH for 96 hours conditions, whereas Examples 11-20 (discs made with pure aluminum) show an unacceptable increase in PI errors and PI failures. Examples 1-10 (silver alloy discs), after exposure at 80° C. at 85% RH conditions for 96 hours, would not play at all in the Vmedia drives and so could not be tested for error rates. After the aging tests, the reflectivity of the silver discs had diminished below the minimum required by the drives.

Multi-Layered Aluminum Alloy Examples

Examples 31-42 included four different types of reflective layers including one to three sputtered layers. The four types of optical discs in Examples 31-42 were made using the configurations/conditions given in Table 1.

TABLE 2

| Layer | Examples 31-33 (Al) | Examples 34-36 (Al + Cr) | Examples 37-39 (Cr + Al) | Examples 40-42 (Cr + Al + Cr) |
|---|---|---|---|---|
| Substrate | 0.55 mm Molded PC | 0.55 mm Molded PC | 0.55 mm Molded PC | 0.55 mm Molded PC |
| Sputtered Layer 1 | 25 nm Aluminum | 25 nm Aluminum | 4 nm Chromium | 4 nm Chromium |
| Sputter Layer 2 | None | 4 nm Chromium | 25 nm Aluminum | 25 nm Aluminum |
| Sputter Layer 3 | None | None | None | 4 nm Chromium |
| Cover Layer* | 111 μm total PSA (31 nm), PC (75 nm), HC (Hard Coat 5 nm) | 111 μm total PSA (31 nm), PC (75 nm), HC (Hard Coat 5 nm) | 111 μm total PSA (31 nm), PC (75 nm), HC (Hard Coat 5 nm) | 111 μm total PSA (31 nm), PC (75 nm), HC (Hard Coat 5 nm) |

*The cover layer, available from Lintec Corp. (Japan), was applied by hand after the sputtering processing was completed.

The location of the rows in Table 1, indicate the location of the layers in the Example optical discs.

The substrate layer of the discs in Examples 31-42 was made by commercial injection molding equipment (Sumitomo, Japan). During this process step the data pits are formed on the surface of the molded substrate.

A commercial optical disc sputtering system, Cube Lite from Oelikon Balzers AG was used to make Examples 31-42. The configuration was changed from the standard installation used in DVD disc manufacture, to accommodate the smaller Vmedia disc size of approximately 32 mm×32 mm×0.6 mm. This involved some modification to the inner and outer masking system to accommodate the smaller Vmedia disc radius.

The targets for each example were made according to the information in the "Reflective Layer" column of Table 1. The targets were configured to the ARQ131 design required by the Cube Lite system. This allowed for the easy exchange of targets with different compositional make up. Standard sputtering conditions for 100% aluminum target were used without modification for each target. The approximate following sputtering conditions were used that yield approximately 35 nm sputter thickness.

| | |
|---|---|
| Sputter Time | 3 sec |
| Sputter Power | 2.5 kW |
| Argon Flow Rate | 5 SCCM |
| Main Chamber Vacuum | 250 Pa |

The reflective layer in Examples 31-33 was a single sputtered pure aluminum layer. Examples 31-33 can be considered comparative examples. The pure aluminum layer was sputtered using a single pure aluminum target. Pure in this context means greater than 99.99% aluminum.

The reflective layer in Examples 34-36 was a multilayered structure wherein the sputtered layer 1 was a pure aluminum sputtered layer, and the sputtered layer 2 was a pure chromium sputtered layer. Pure in the context of pure chromium means greater than 99% chromium. The multilayered reflective layer was made by first sputtering the discs in a chamber using an aluminum target. The discs were then removed from the chamber and the target was changed to a chromium target. The discs were put back into the chamber and resputtered with chromium.

The reflective layer in Examples 37-39 was a multilayered structure wherein the sputtered layer 1 was a pure chromium sputtered layer, and the sputtered layer 2 was a pure aluminum sputtered layer. The multilayered reflective layer was made by first sputtering the discs in a chamber using a chromium target. The discs were then removed from the chamber and the target was changed to a aluminum target. The discs were put back into the chamber and resputtered with aluminum.

The reflective layer in Examples 40-42 was a multilayered structure wherein the sputtered layer 1 was a pure chromium sputtered layer, the sputtered layer 2 was a pure aluminum sputtered layer, and the sputtered layer 3 was a second pure chromium layer. The multilayered reflective layer was made by first sputtering the discs using a chromium target. Then the discs were removed from the chamber and the target was changed to an aluminum target. The discs were put back into the chamber and resputtered with aluminum. Finally, the discs were removed from the chamber and the target was changed to a chromium target, and the discs were put back into the chamber and resputtered with chromium.

Examples 31-42 were tested for initial error rates using a disc tester available from Vmedia Research Inc., Boulder, Co. The discs were then subjected to an environment of 80° C. and 85% RH for 96 hrs exposure. After conditioning the discs at a temperature of 25° C. and 50% RH for 24 hrs, the discs were retested for error rates on the same Vmedia disc tester.

Figure 4:
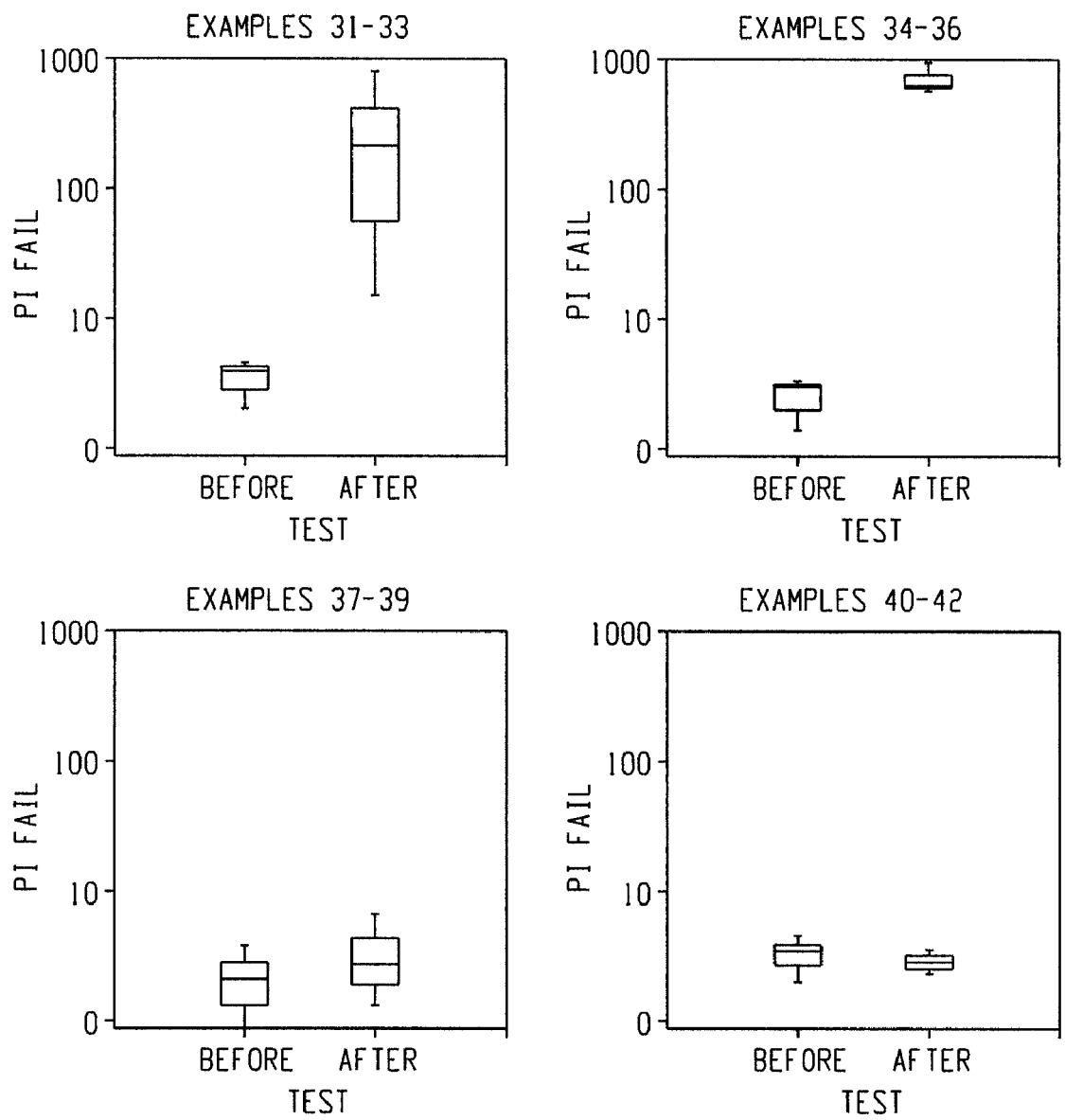
FIG. 4 is a series of graphs showing PI fail characteristics before and after aging tests for four sets of example discs.

The results of error rates before and after the environmental tests are shown in FIG. 4, and the data used to generate the charts in FIG. 4 is presented in Table 2.

TABLE 2

| Test | Example No. | Layers | PIC | PIF |
|---|---|---|---|---|
| Before | 31 | Al | 28 | 4.1 |
| Before | 32 | Al | 16 | 2.1 |
| Before | 33 | Al | 26 | 4.6 |
| Before | 34 | Al + Cr | 30 | 3.2 |
| Before | 35 | Al + Cr | 26 | 1.4 |
| Before | 36 | Al + Cr | 27 | 3.1 |
| Before | 37 | Cr + Al | 25 | 2.2 |
| Before | 38 | Cr + Al | 13 | 0.9 |
| Before | 39 | Cr + Al | 36 | 3.9 |
| Before | 40 | Cr + Al + Cr | 47 | 4.8 |
| Before | 41 | Cr + Al + Cr | 45 | 3.6 |
| Before | 42 | Cr + Al + Cr | 22 | 2.1 |

TABLE 2-continued

| Test | Example No. | Layers | PIC | PIF |
|---|---|---|---|---|
| After | 31 | Al | 2264 | 800.7 |
| After | 32 | Al | 2239 | 215.6 |
| After | 33 | Al | 1090 | 14.9 |
| After | 34 | Al + Cr | 3742 | 605.7 |
| After | 35 | Al + Cr | 3651 | 956.9 |
| After | 36 | Al + Cr | 3178 | 655.9 |
| After | 37 | Cr + Al | 44 | 2.8 |
| After | 38 | Cr + Al | 24 | 1.3 |
| After | 39 | Cr + Al | 65 | 6.8 |
| After | 40 | Cr + Al + Cr | 49 | 3.6 |
| After | 41 | Cr + Al + Cr | 37 | 2.4 |
| After | 42 | Cr + Al + Cr | 45 | 3 |

This written description sets forth the best mode of the invention, and describes the invention so as to enable a person skilled in the art to make and use the invention, by presenting examples. The patentable scope of the invention is defined by the claims, and may include other examples that occur to those skilled in the art.

We claim:

1. An optical disc comprising: a substrate layer; a cover layer; and an aluminum alloy layer between the substrate layer and cover layer, and adjacent to the substrate layer; wherein the aluminum alloy layer comprises a majority amount of aluminum and an additional metal selected from the group consisting of chromium, titanium, tantalum, and any combination thereof, wherein the aluminum alloy layer comprises a layered structure comprising: a first layer including a metal component, a second layer including a second metal component, the second layer being adjacent to the substrate layer; wherein the metal component is aluminum and the second metal component is the additional metal.

2. The optical disc of claim 1, wherein the weight of additional metal in the aluminum alloy layer is 0.5% to 4.0% of the total weight of the aluminum and additional metal.

3. The optical disc of claim 1, wherein the additional metal is chromium.

4. The optical disc of claim 1, wherein the aluminum alloy layer comprises a mixture of the additional metal in the aluminum.

5. The optical disc of claim 1, further comprising a third layer including the second metal component; wherein the first layer is between the second and third layers.

6. The optical disc of claim 1, wherein the signal to noise ratio is less than 8% data to clock jitter.

7. The optical disc of claim 1, wherein the aluminum alloy layer has a reflectivity of 15 to 77% at a 405 nm wavelength.

8. The optical disc of claim 1, wherein the optical disc has a 32 mm×32 mm×0.6 mm form factor.

9. The optical disc of claim 2, wherein the aluminum alloy layer consists essentially of the aluminum and the additional metal, wherein the additional metal includes chromium.

10. The optical disk of claim 1, wherein the metal component consists essentially of aluminum, and the second metal component, consists essentially of chromium.

11. The optical disk of claim 1, wherein the thickness of the aluminum alloy layer is from 15 to 100 nm.

12. The optical disk of claim 1, wherein the thickness of the first layer is between 5 nm and 15 nm, and the thickness of the second layer is between 15 nm and 100 nm.

13. A method of making an optical disc comprising the steps of: forming a substrate layer; sputtering a first target including a majority amount of an additional metal onto the substrate layer, wherein the additional metal is chromium, titanium, tantalum, and any combination thereof, thereby forming an additional metal layer; sputtering a second target including a metal onto the additional metal layer, wherein the metal is aluminum, thereby forming an aluminum layer; and forming a cover layer; wherein the aluminum alloy layer comprises a majority amount of aluminum and an additional metal selected from the group consisting of: chromium, titanium, tantalum, and any combination thereof.

14. The method of claim 13, wherein the thickness of the aluminum layer is 5 nm to 15 nm, and the thickness of the additional metal layer is 15 nm to 100 nm.

15. The method of claim 13, wherein the weight of additional metal is 0.5% to 4.0% of the total weight of the aluminum and additional metal.

16. The method of claim 13, further comprising sputtering a second additional metal layer onto the aluminum layer.

17. The method of claim 13, wherein the additional metal layer consists essentially of chromium and the aluminum layer consists essentially of aluminum.

18. The optical disc of claim 1 wherein the cover layer is essentially free of UV cured hardcoat.

19. The optical disc of claim 5 wherein the second layer is 4 nm thick and consists of chromium, the first layer consists of aluminum and the third layer consists of chromium.

20. The optical disc of claim 19 wherein each of the second and third layers is 4 nm thick and the first layer is 25 nm thick.

21. An optical disc comprising: a substrate layer; a cover layer; and an aluminum alloy layer between the substrate layer and cover layer, and adjacent to the substrate layer; wherein the aluminum alloy layer comprises a majority amount of aluminum and an additional metal selected from the group consisting of: chromium, titanium, tantalum, and any combination thereof, wherein the aluminum alloy layer comprises a layered structure comprising: a first layer including a metal component, a second layer including a second metal component, the second layer being adjacent to the substrate layer; wherein the metal component is the additional metal and the second metal component is aluminum.

22. The optical disc of claim 21 wherein the first layer consists of chromium and the second layer consists of aluminum.

23. The optical disc of claim 22 wherein the first layer is 4 nm thick and the second layer is 25 nm thick.

\* \* \* \* \*